United States Patent
Bang

(10) Patent No.: US 9,826,667 B2
(45) Date of Patent: Nov. 21, 2017

(54) DISPLAY DEVICE

(71) Applicant: LG Display Co., Ltd., Seoul (KR)

(72) Inventor: JinYoung Bang, Gumi (JP)

(73) Assignee: LG Display Co., Ltd., Seoul (KR)

( * ) Notice: Subject to any disclaimer, the term of this patent is extended or adjusted under 35 U.S.C. 154(b) by 90 days.

(21) Appl. No.: 14/950,476

(22) Filed: Nov. 24, 2015

(65) Prior Publication Data
US 2016/0316583 A1    Oct. 27, 2016

(30) Foreign Application Priority Data

Apr. 27, 2015  (KR) .................. 10-2015-0059179
Jun. 9, 2015  (KR) .................. 10-2015-0081141

(51) Int. Cl.
  *H05K 7/00*   (2006.01)
  *H05K 5/00*   (2006.01)
  *H05K 7/20*   (2006.01)
  *H05K 9/00*   (2006.01)
  *G02F 1/1333*  (2006.01)

(52) U.S. Cl.
CPC ... *H05K 7/20963* (2013.01); *G02F 1/133308* (2013.01); *H05K 9/0067* (2013.01); *G02F 2001/133314* (2013.01); *G02F 2001/133325* (2013.01)

(58) Field of Classification Search
CPC ...................................... H05K 1/147
USPC ...................................... 361/679.01
See application file for complete search history.

(56) References Cited

U.S. PATENT DOCUMENTS

2009/0135568 A1*  5/2009  Jeong .............. H05K 1/147
                                                361/749

* cited by examiner

*Primary Examiner* — Jerry Wu
(74) *Attorney, Agent, or Firm* — Fenwick & West LLP

(57) ABSTRACT

A display device includes a display panel; a back cover having a front side facing the display panel and a rear side opposite the front side, the back cover having a back cover cavity open on at least the rear side of the back cover; a nut coupled to the back cover, a lower body of the nut disposed in the back cover cavity, a stopper of the nut protruding along the rear side of the back cover and in contact with the rear side of the back cover, the nut having a fastening cavity; and a screw comprising an engaging portion and a head, the engaging portion held in the fastening cavity of the nut, the screw securing a printed circuit board between the head of the screw and the back cover.

18 Claims, 19 Drawing Sheets

FIG.4
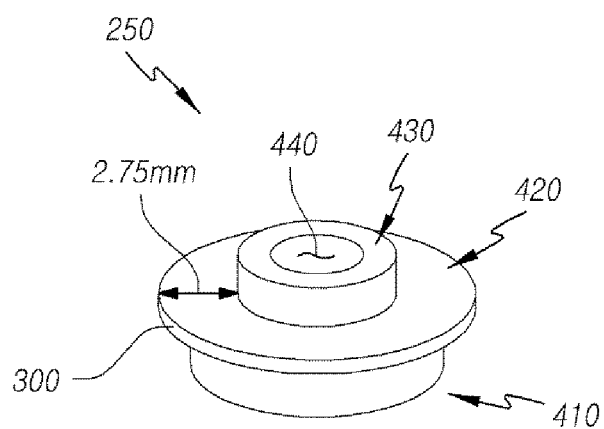
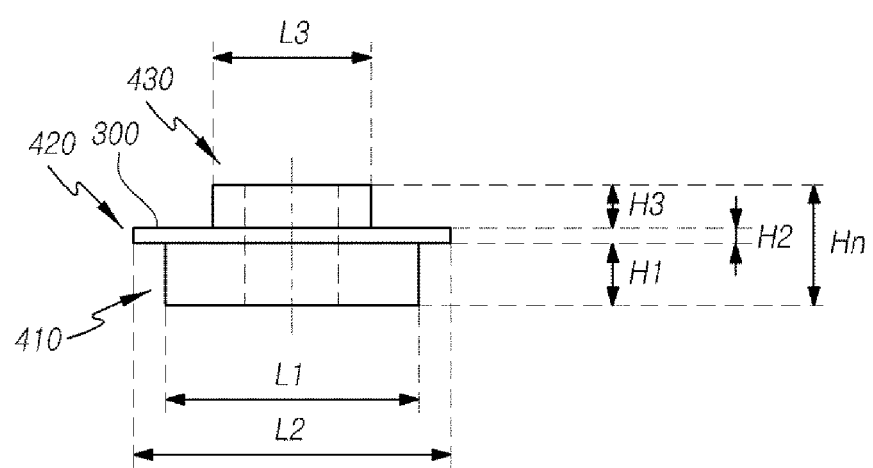
L2 > L1 > L3

FIG.6
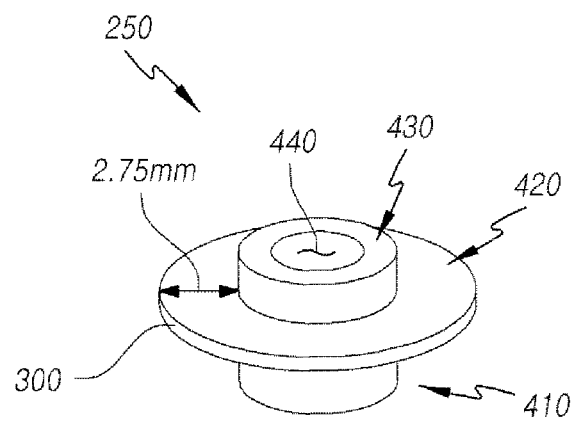
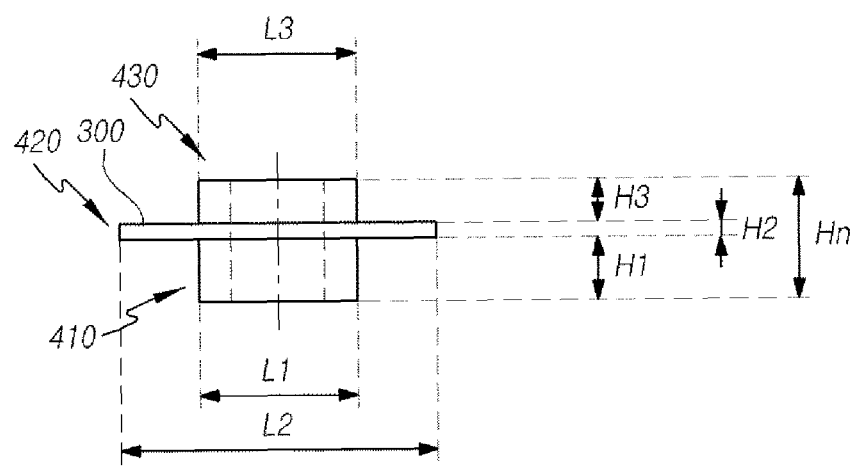
L2 > L1 = L3

DISPLAY DEVICE

CROSS REFERENCE TO RELATED APPLICATION

This application claims priority from and the benefit under 35 U.S.C. §119(a) to Republic of Korea Patent Application Number 10-2015-0059179, filed on Apr. 27, 2015, and to Republic of Korea Patent Application Number 10-2015-0081141, filed on Jun. 9, 2015, both of which are hereby incorporated by reference for all purposes as if fully set forth herein.

BACKGROUND OF THE INVENTION

Field of the Invention

Embodiments of this disclosure relate to a display device.

Description of Related Art

Various types of display devices such as liquid crystal displays (LCDs), plasma display panels (PDPs), and organic light-emitting diode (OLED) display devices are currently in widespread use.

Such a display device includes a display panel, a back cover covering the backside of the display panel, and a printed circuit board (PCB) electrically connected to the display panel.

The display device includes a structure allowing the back cover covering the backside of the display panel to be fastened to the PCB.

In the related art, the portion of the back cover fastened to the PCB is thermally expanded and contracted, which may cause abnormalities in the screen, create vibrations or generate noise.

Static electricity may also form in a printed circuit board (PCB). In the related art, a circuit or signal line is commonly added for electrostatic discharge protection, which problematically complicates the design of the display device.

SUMMARY

In one embodiment, a display device comprises a display panel; a back cover having a front side facing the display panel and a rear side opposite the front side, the back cover having a back cover cavity open on at least the rear side of the back cover; a nut coupled to the back cover, a lower body of the nut disposed in the back cover cavity, a stopper of the nut protruding along the rear side of the back cover and in contact with the rear side of the back cover, the nut having a fastening cavity; and a screw comprising an engaging portion and a head, the engaging portion held in the fastening cavity of the nut, the screw securing a printed circuit board between the head of the screw and the back cover.

In one embodiment, a fastening structure in a display device comprises a nut and a screw engaged with the nut. The nut comprises a lower body disposed in a back cover cavity in a back cover having a front side facing a display panel and a rear side opposite the front side cover, the back cover cavity open on at least the rear side of the back cover; and a stopper protruding along the rear side of the back cover and in contact with the rear side of the back cover. The screw comprises an engaging portion held in a fastening cavity within at least the lower body and the stopper; and a head securing a printed circuit board of the display device between the head of the screw and the back cover.

In one embodiment, a method of manufacturing a display device comprises fitting a lower body of a nut into a back cover cavity in a back cover through an opening in a rear side of the back cover opposite a front side of the back cover facing a display panel to place a stopper in contact with the rear side of the back cover; placing a bottom insulating plate onto the rear side of the back cover, a hole in the bottom insulating plate placed around the stopper of the nut protruding along the rear side of the back cover; placing a printed circuit board onto the bottom insulating plate and the stopper of the nut with a hole in the printed circuit board placed around an upper body of the nut having a diameter less than a diameter of the stopper; and joining an engaging portion of a screw into a fastening cavity in the nut to cause a head of the screw to secure the printed circuit board and the bottom insulating plate to the back cover.

It is to be understood that both the foregoing general description and the following detailed description of the present invention provide examples to further illustrate and explain the invention as claimed.

BRIEF DESCRIPTION OF THE DRAWINGS

The above and other objects, features and advantages of the present invention will be more clearly understood from the following detailed description when taken in conjunction with the accompanying drawings, in which:

FIG. 4, FIG. 5, and FIG. 6 illustrate the structure of the nut fastening the SPCB and the back cover in the display device according to one embodiment;

DETAILED DESCRIPTION

Figure 1:
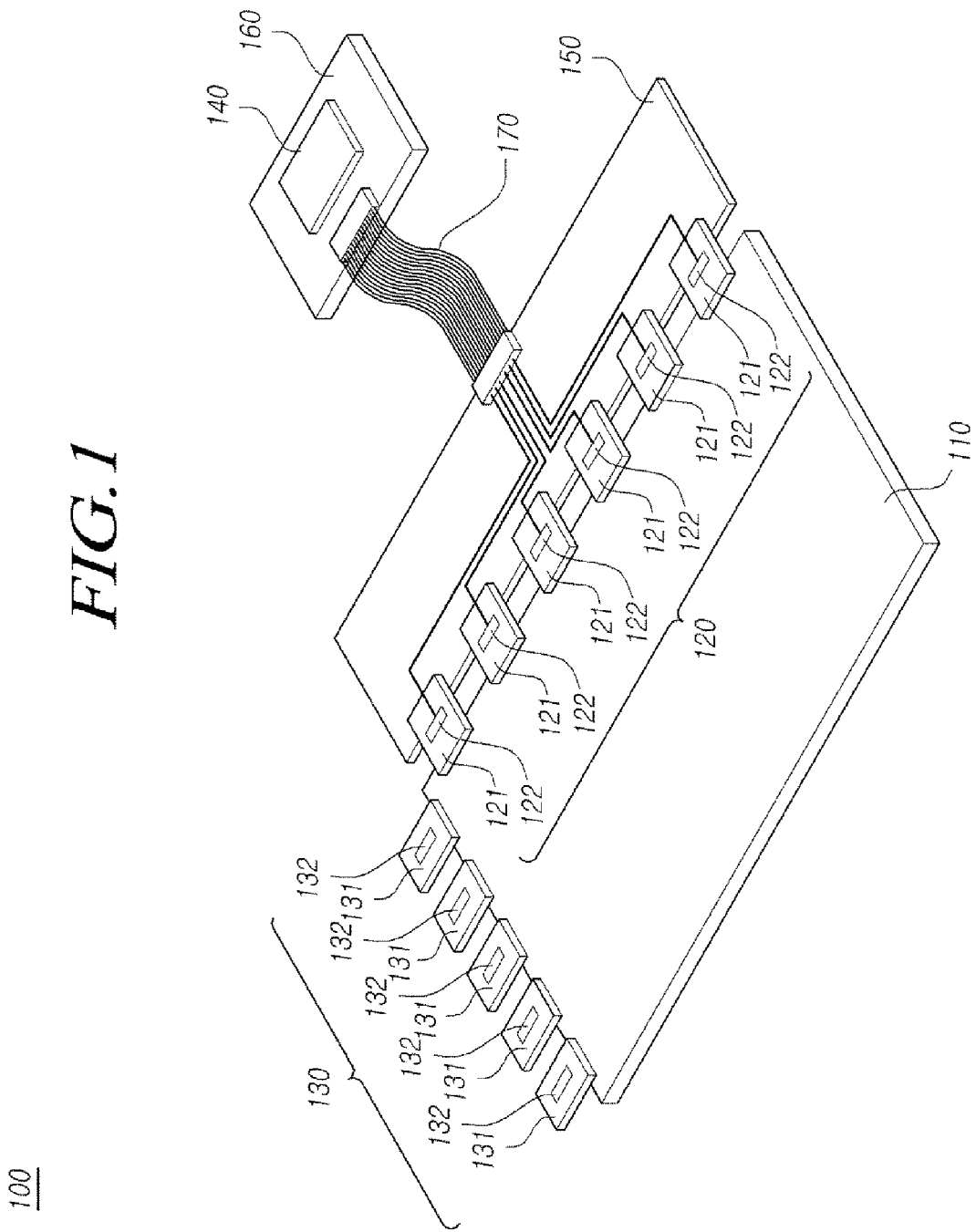
FIG. 1 is a schematic perspective view illustrating the system configuration of an example display device according to one embodiment.

Reference will now be made in detail to embodiments of the present invention, examples of which are illustrated in the accompanying drawings. Throughout this document, reference should be made to the drawings, in which the same reference numerals and signs will be used to designate the same or like components. In the following description of the present invention, detailed descriptions of known functions and components incorporated herein will be omitted in the case that such description will render unclear the subject matter of the present invention.

It will also be understood that, although terms such as "first," "second," "A," "B," "(a)," and "(b)" may be used herein to describe various elements, such terms are only used to distinguish one element from another element. The substance, sequence, order, or number of these elements is not limited by these terms. It will be understood that when an element is referred to as being "connected to" or "coupled to" another element, not only can it be "directly connected" or "coupled to" the other element, but also can be "indirectly connected or coupled to" the other element via an "intervening" element. In the same context, it will be understood that when an element is referred to as being formed "on" or "under" another element, not only can it be directly formed on or under another element, but it can also be indirectly formed on or under another element via an intervening element.

FIG. 1 is a schematic perspective view illustrating the system configuration of an example display device according to one embodiment. Referring to FIG. 1, the display device 100 includes a display panel 110 on which a plurality of data lines and a plurality of gate lines are disposed such that a plurality of sub-pixels are formed, a data driver 120 connected to the display panel 110 to drive the plurality of data lines, a gate driver 130 driving the plurality of gate lines, and a timing controller 140 controlling the data driver 120 and the gate driver 130.

The data driver 120 drives the plurality of data lines by supplying data voltages to the plurality of data lines.

The gate driver 130 sequentially drives the plurality of gate lines by sequentially supplying scanning signals to the plurality of gate lines.

The timing controller 140 controls the data driver 120 and the gate driver 130 by supplying a variety of control signals to the data driver 120 and the gate driver 130. The timing controller 140 starts scanning according to the timing for each frame, outputs converted image data by converting image data input by an external source into a data signal format used by the data driver 120, and regulates data processing at a suitable point in time in response to the scanning.

The gate driver 130 sequentially drives the plurality of gate lines by sequentially supplying scanning signals having an on or off voltage to the plurality of gate lines under the control of the timing controller 140.

As illustrated in FIG. 1, the gate driver 130 is positioned on one side of the display panel 110. Depending on the driving type or the design of the display panel, the gate driver 130 may be divided into two sections positioned on opposite sides of the display panel 110.

The gate driver 130 may include one or more gate driver integrated circuits (ICs).

The gate driver ICs may be connected to the bonding pad of the display panel 110 by a tape-automated bonding (TAB) method or a chip-on-glass (COG) method or may be implemented as a gate-in-panel (GIP)-type IC directly disposed on the display panel 110. In some cases, the gate driver ICs may be directly formed on the display panel 110, forming a portion of the display panel 110.

As illustrated in FIG. 1, the gate driver ICs are constructed by a chip-on-film method. In this case, gate driving chips 132 corresponding to the gate driver ICs are respectively mounted on flexible films 131, in which one end of each flexible film 131 is bonded to the display panel 110.

When a specific gate line is opened, the data driver 120 drives the plurality of data lines by converting image data received from the timing controller 140 into analog data voltages and supplying the analog data voltages to the plurality of data lines.

The data driver 120 can drive the plurality of data lines including one or more source driver ICs.

The source driver ICs may be connected to the bonding pads of the display panel 110 by a tape-automated bonding (TAB) method or a chip-on-glass (COG) method or may be directly disposed on the display panel 110. In some cases, the source driver ICs may be directly formed on the display panel 110, forming a portion of the display panel 110.

As illustrated in FIG. 1, the source driver ICs are formed by a chip-on-film (COF) method. In this case, source driving chips 122 corresponding to the source driver ICs are respectively mounted on flexible films 121, in which one end of each flexible film 121 is bonded to a source printed circuit board (SPCB) 150, and the other end of each flexible film 121 is bonded to the display panel 110.

Referring to FIG. 1, the SPCB 150 is connected to a control PCB 160 via a connection medium 170, such as a flexible flat cable (FFC) or a flexible printed circuit (FPC).

The timing controller 140 is disposed on the control PCB 160.

A power controller (not shown) supplying a variety of voltages or currents to the display panel 110, the data driver 120, and the gate driver 130 or controlling the variety of voltages or currents to be supplied may be further disposed on the control PCB 160.

The SPCB 150 and the control PCB 160 as described above may be implemented as a single PCB.

The display device 100 according to one embodiment may be a liquid crystal display (LCD) device, an organic light-emitting diode (OLED) display device, or the like.

Figure 2:
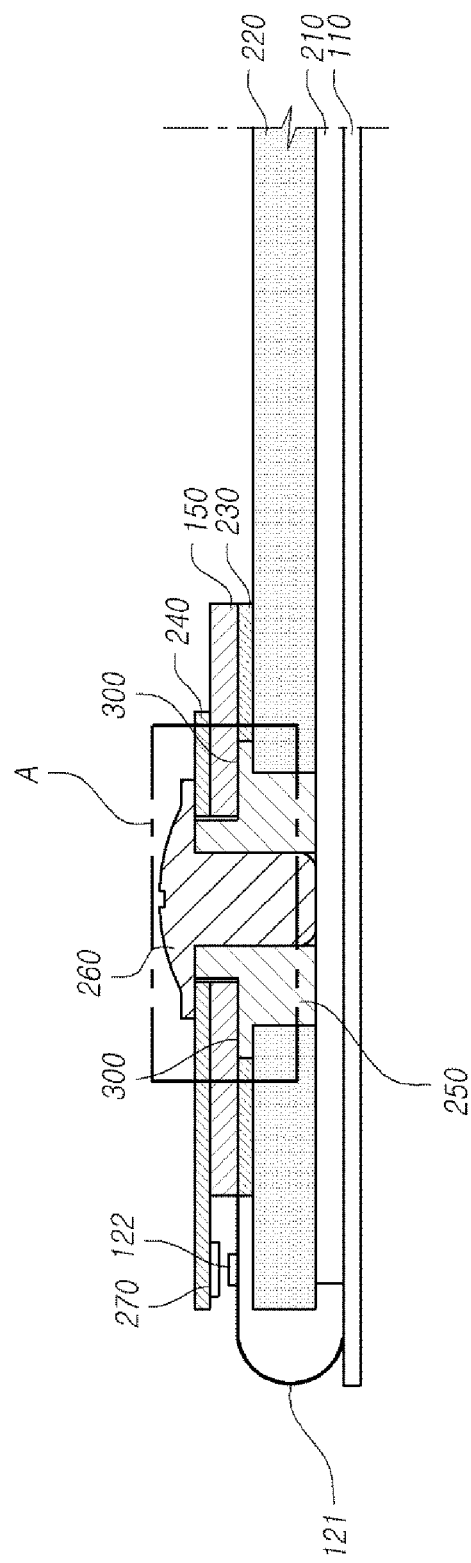
FIG. 2 is a cross-sectional view of the display device according to one embodiment.
Figure 3:
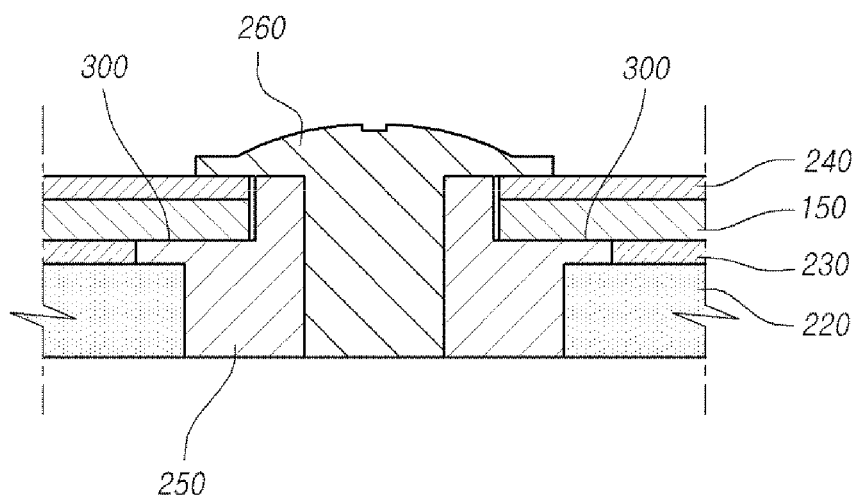
FIG. 3 illustrates an example fastening structure between the source printed circuit board (SPCB) and the back cover in the display device according to one embodiment.

FIG. 2 is a cross-sectional view of the display device 100 according to one embodiment. FIG. 3 is an enlarged cross-sectional view of part A in FIG. 2, which is a fastening structure between the SPCB 150 and a back cover 220 in the display device 100 according to one embodiment.

Referring to FIG. 2, the display device 100 according to one embodiment includes the back cover 220 covering the backside of the display panel 110.

In each flexible film 121 on which the corresponding source driving chip 122 is mounted, one side of the flexible film 121 is bonded to the display panel 110, and the other side of the flexible film 121 is bonded to the SPCB 150.

The flexible film 121 is bent such that the SPCB 150 is positioned over the back cover 220.

The SPCB 150 disposed over the back cover 220 in this manner is fixed in an immobile position.

To secure the SPCB 150 on the back cover 220, the display device 100 according to one embodiment has the fastening structure between the SPCB 150 and the back cover 220.

Referring to FIG. 2 and FIG. 3, the display device 100 according to one embodiment uses a nut-screw engagement structure including a nut 250 and a screw 260 as the fastening structure between the back cover 220 and the SPCB 150.

The nut 250 is press-fitted into the back cover 220 and is fitted into a hole (151 in FIG. 11) of the SPCB 150.

The screw 260 is engaged into a fastening recess or a fastening hole (440 in FIG. 4) of the nut 250. Although the drawings subsequent to FIG. 2 indicate that the screw 260 is engaged with the fastening hole 440 of the nut 250, this is merely illustrated for the sake of explanation. The fastening structure may be changed by fastening the screw 260 to the fastening recess of the nut 250.

Referring to FIG. 3, the nut 250 has a stopper 300 protruding along the rear surface of the SPCB 150. The stopper 300 adjoins the rear surface of the SPCB 150.

A screen may become uneven instead of being smooth and flat due to the engagement force between the screw 260 and the nut 250. This unevenness is reduced in areas of the screen where the nut 250 is disposed because the nut 250 has the stopper 300 supporting the rear surface of the SPCB 150. That is, the stopper 300 of the nut 250 can improve screen flatness.

In addition, the stopper 300 disposed on the nut 250 can provide a path along which static electricity generated by the SPCB 150 is discharged to the back cover 220. This can consequently reduce the chances of the circuit of the SPCB 150 from being damaged by static electricity.

Referring to FIG. 2 and FIG. 3, the display device 100 according to one embodiment further includes a bottom insulating plate 230 positioned between the back cover 220 and the SPCB 150.

In the display device 100 according to one embodiment, the bottom insulating plate 230 is disposed over the back cover 220 covering the backside of the display panel 110, and the SPCB 150 is positioned over the bottom insulating plate 230.

The bottom insulating plate 230 prevents a short circuit between the circuit of the SPCB 150 and the back cover 220 and protects the circuit of the SPCB 150.

In this case, the nut 250 is fitted into both a hole (231 in FIG. 11) in the bottom insulating plate 230 and a hole (151 in FIG. 11) in the SPCB 150.

In addition, referring to FIG. 2 and FIG. 3, the display device 100 according to one embodiment further includes a cover shield 240 disposed over the SPCB 150.

The cover shield 240 serves to protect the SPCB 150 and source driving chip 122 and also to dissipate heat from the SPCB 150 and the source driving chip 122.

For the heat dissipation function, the cover shield 240 is formed of a material having high thermal conductivity such as aluminum (Al).

Referring to FIG. 2, the backside of the display panel 110 and the back cover 220 are coupled by means of a coupling member 210 such as a magnet or double-sided tape.

Referring to FIG. 2, the source driving chip 122 is mounted on the flexible film 121, where one side of the flexible film 121 is bonded to the display panel 110, and where the other side of the flexible film 121 is bonded to the SPCB 150. Regarding the mounting position, the source driving chip 122 is positioned in a narrow space between the cover shield 240 and the back cover 220.

Regarding the position of the source driving chip 122, heat generated by the source driving chip 122 may not be dissipated, remaining trapped in the narrow space between the cover shield 240 and the back cover 220.

In this case, the temperature of the source driving chip 122 may rise, causing a problem.

In order to mitigate this problem, the display device 100 according to one embodiment further includes a heat dissipation pad 270 disposed between the source driving chip 122 and the cover shield 240 that dissipates heat.

As such, the heat dissipation pad 270 is positioned between the source driving chip 122 and the cover shield 240 and is attached to the cover shield 240, so the heat dissipation pad 270 can dissipate heat generated by the source driving chip 122 and improve reliability of the source driving chip 122.

A more detailed description of the above-mentioned fastening structure between the SPCB 150 and the back cover 220 will now be given with reference to FIG. 4 to FIG. 6.

Figure 5:
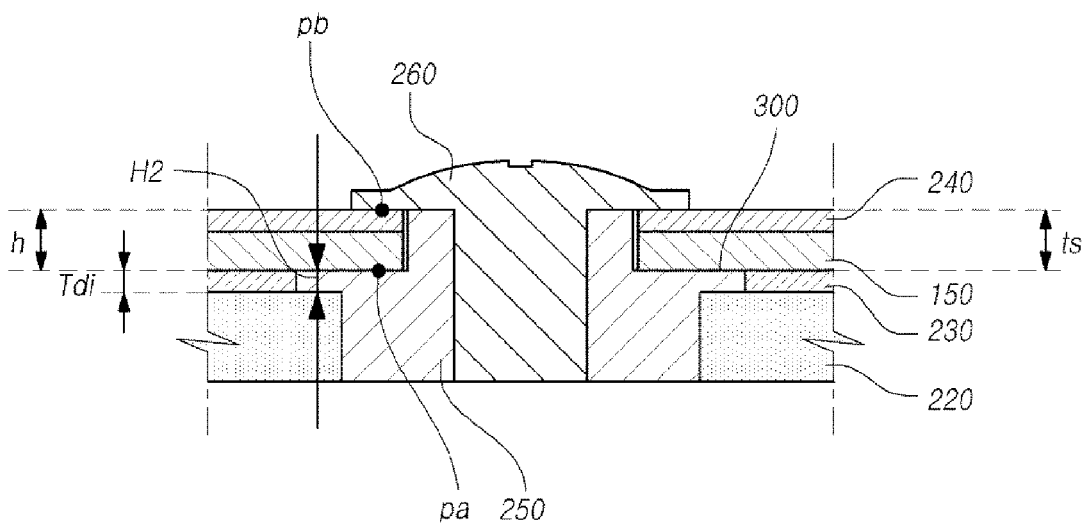

FIG. 4, FIG. 5, and FIG. 6 illustrate the structure of the nut 250 fastening the SPCB 150 and the back cover 220 in the display device to according to one embodiment.

Referring to FIG. 4, the nut 250 includes a lower body 410, a middle body 420, and an upper body 430.

The lower body 410 is a portion to be press-fitted into the back cover 220.

The middle body 420 is a portion to be fitted into the hole (231 in FIG. 11) of the bottom insulating plate 230, and the stopper 300 is formed on the middle body 420.

The diameter L2 of the middle body 420 is less than or equal to the diameter of the hole 231 of the bottom insulating plate 230.

The upper body 430 is a portion that is fitted into the hole (151 in FIG. 11) of the SPCB 150, and the upper body 430 is formed around a fastening cavity such as a fastening recess or the fastening hole 440 with which the screw 260 is engaged.

As used herein, "hole" may refer to a structure in which the top and bottom portions are completely open, "recess" may refer to a structure in which the top and bottom portions may not be completely open, and "cavity" may refer to either a hole or a recess.

The screw 260 is engaged with the nut 250 by being fitted into the fastening recess or the fastening hole 440 of the nut 250.

Referring to FIG. 5, the height H2 of the middle body 420 is equal to the thickness Tdi of the bottom insulating plate 230.

As the height H2 of the middle body 420 is equal to the thickness Tdi of the bottom insulating plate 230 disposed between the back cover 220 and the SPCB 150, the stopper 300 of the middle body 220 can be formed along the rear surface of the SPCB 150 without press-fitting of the middle body 420 into the back cover 220. Since the height H2 of the middle body 420 is equal to the thickness Tdi of the bottom insulating plate 230 disposed between the back cover 220 and the SPCB 150, it is possible to easily assemble the fastening structure between the SPCB 150 and the back cover 220.

Referring to FIG. 4, the diameter L2 of the middle body 420 is greater than the diameter L1 of the lower body 410 and greater than the diameter L3 of the upper body 430, such that the stopper 300 can be formed on the middle body 420.

As described above, since the stopper 300 is formed on the middle body 420 by designing the diameter L2 of the middle body 420 to be greater than the diameter L1 of the lower body 410 and greater than the diameter L3 of the upper body 430, the nut 250 can support the rear surface of the SPCB 150 and improve screen flatness.

In addition, the diameter L2 of the middle body 420 is greater than the diameter L1 of the lower body 410 and greater than the diameter L3 of the upper body 430, so the middle body 420 protrudes along the rear surface of the SPCB 150.

The portion of the middle body 420 protruding along the rear surface of the SPCB 150 corresponds to the stopper 300.

The stopper 300 of the middle body 420 protruding along the rear surface of the SPCB 150 is electrically connected to the rear surface of the SPCB 150.

Thus, the stopper 300 of the middle body 420 protruding along the rear surface of the SPCB 150 acts a discharge path along which static electricity generated by the SPCB 150 can be discharged to the back cover 220. This can consequently prevent the circuit of the SPCB 150 from being damaged by static electricity.

In addition, as illustrated in FIG. 4, the diameter L1 of the lower body 410 of the nut 250 is greater than the diameter L3 of the upper body 430.

Since the diameter L1 of the lower body 410 of the nut 250 is greater than the diameter L3 of the upper body 430 of the nut 250 as above, the nut 250 can be firmly press-fitted into the back cover 220, thereby ensuring that the fastening structure between the SPCB 150 and the back cover 220 is firm and reliable.

In another embodiment illustrated in FIG. 6, the diameter L1 of the lower body 410 of the nut 250 is equal to the diameter L3 of the upper body 430 of the nut 250 in order to facilitate the fabrication of the nut 250.

Referring to FIG. 5, the height h from the top point pa of the middle body 420 of the nut 250 to the bottom point pb of a head (830 in FIG. 9) of the screw 260 is greater than or equal to the total of the thickness of the SPCB 150 and the thickness of the cover shield 240 positioned between the top point pa of the middle body 420 and the bottom point pb of the head of the screw 260.

This configuration can prevent the SPCB 150 from being too strongly fixed between the head (830 in FIG. 9) of the screw 260 and the middle body 420 of the nut 250, allowing the SPCB 150 to move at least slightly.

Figure 7A:
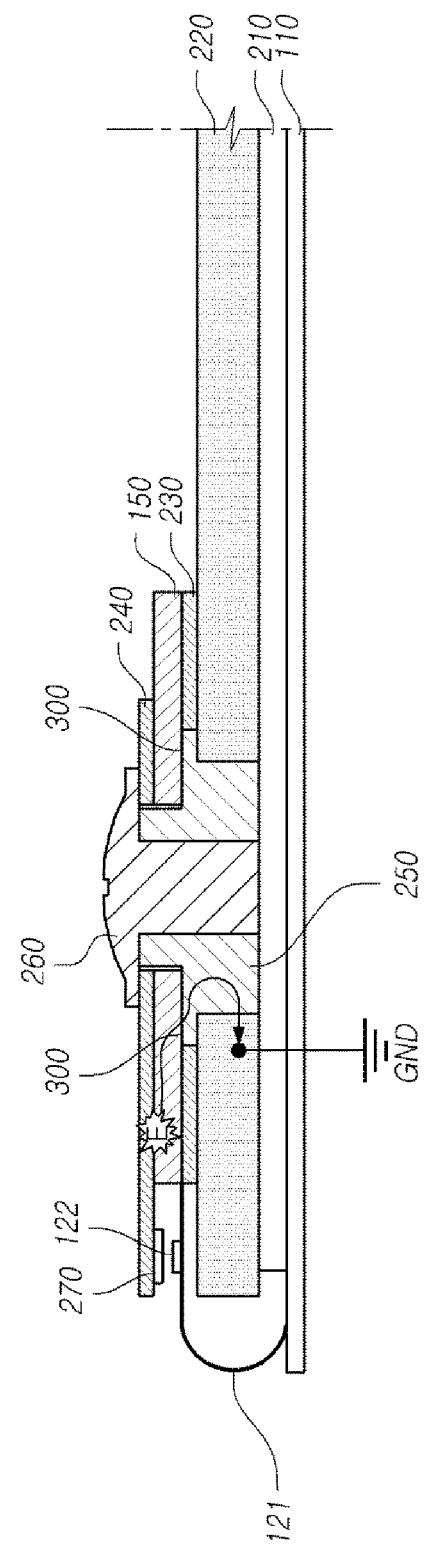
FIG. 7A and FIG. 7B illustrate an electrostatic discharge structure using the fastening structure between the SPCB and the back cover in the display device according to one embodiment.
Figure 7B:
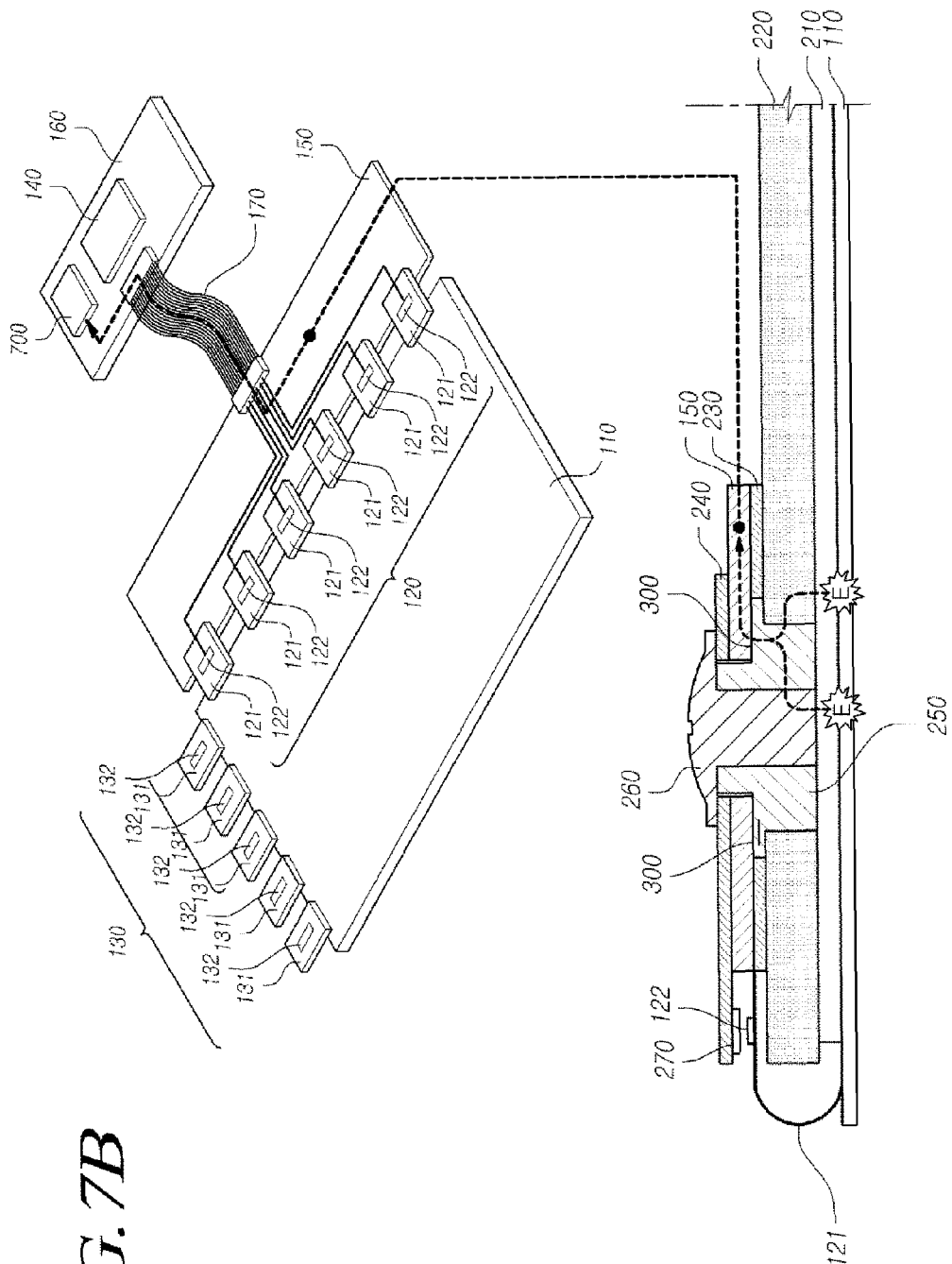

FIG. 7A and FIG. 7B illustrate an electrostatic discharge structure using the fastening structure between the SPCB 150 and the back cover 220 in the display device 100 according to one embodiment.

Referring to FIG. 7A, the stopper 300 formed on the middle body 420 of the nut 250 protrudes along the rear surface of the SPCB 150, such that the stopper 300 is electrically connected to the rear surface of the SPCB 150 and is electrically connected to the back cover 220 that acts as a ground.

With this configuration, the stopper 300 formed on the middle body 420 of the nut 250 acts as a discharge path along which static electricity E generated by the SPCB 150 can be discharged to the back cover 220 acting as the ground. This can consequently prevent the circuit of the SPCB 150 from being damaged by the static electricity E.

Since the fastening structure between the SPCB 150 and the back cover 220 also acts as the electrostatic discharge structure, it is possible to obtain an electrostatic discharge effect without adding an electrostatic discharge circuit (including an electrostatic discharge line) that would hinder the realization of a small bezel and a small thickness. It is therefore possible to advantageously obtain both the electrostatic discharge effect and high degree of freedom of design.

Although the electrostatic discharge structure has been described with reference to FIG. 7A that the back cover 220 acts as the ground, this is not intended to be limiting. Referring to FIG. 7B, a power supply part 700 mounted on the control PCB 160 may act as a ground. The power supply part 700 is also referred to as an AC (alternating current) power supply or a power management integrated circuit (PMIC).

FIG. 7B illustrates another example electrostatic discharge structure in which the power supply part 700 acts as a ground.

Referring to FIG. 7B, the display panel 110 and the back cover 220 can be coupled by means of a conductive coupling member 210 such as a conductive tape.

When static electricity E forms in the display panel 110, the static electricity E accumulates in the back cover 220 through the conductive coupling member 210.

The static electricity E accumulated in the back cover 220 is transferred to the screw 260 or the lower body 410 of the nut 250. The static electricity E is subsequently transferred to the SPCB 150 through the stopper 300 of the middle body 420 of the nut 250.

The static electricity E that has been transferred to the SPCB 150 is transferred to the control PCB 160 through the connection medium 170, such as a flexible flat cable (FFC) or a flexible printed circuit (FPC), and is finally transferred to the power supply part 700 on the control PCB 160. In this manner, the static electricity E formed in the display panel 110 can be discharged.

This can consequently prevent the SPCB 150 as well as the control PCB 160 and a variety of electronics (such as the source driving chips 122 and the timing controller 140) electrically connected to the SPCB 150 from being damaged by the static electricity E that has accumulated in the back cover 220.

As the middle body 420 of the nut 250 protrudes along the rear surface of the SPCB 150 as described above, the area in which the nut 250 adjoins the SPCB 150 increases, thereby improving electrostatic discharge protection.

In addition, since the lower body 410 of the nut 250 is formed wider than the upper body 430 of the nut 250 as illustrated in FIG. 4, it is possible to reliably press-fit the nut 250 into the back cover 220 and increase the area of the nut 250 through which the static electricity E that has entered the back cover 220 from the display panel 110 can flow to facilitate efficient electrostatic discharge.

The fastening structure between the SPCB 150 and the back cover 220 enables electrostatic discharge, improves screen flatness, and improves the degree of freedom of design using the structural features of the nut 250.

Below, the fastening structure between SPCB 150 and the back cover 220 to which several components are added is described.

Figure 8:
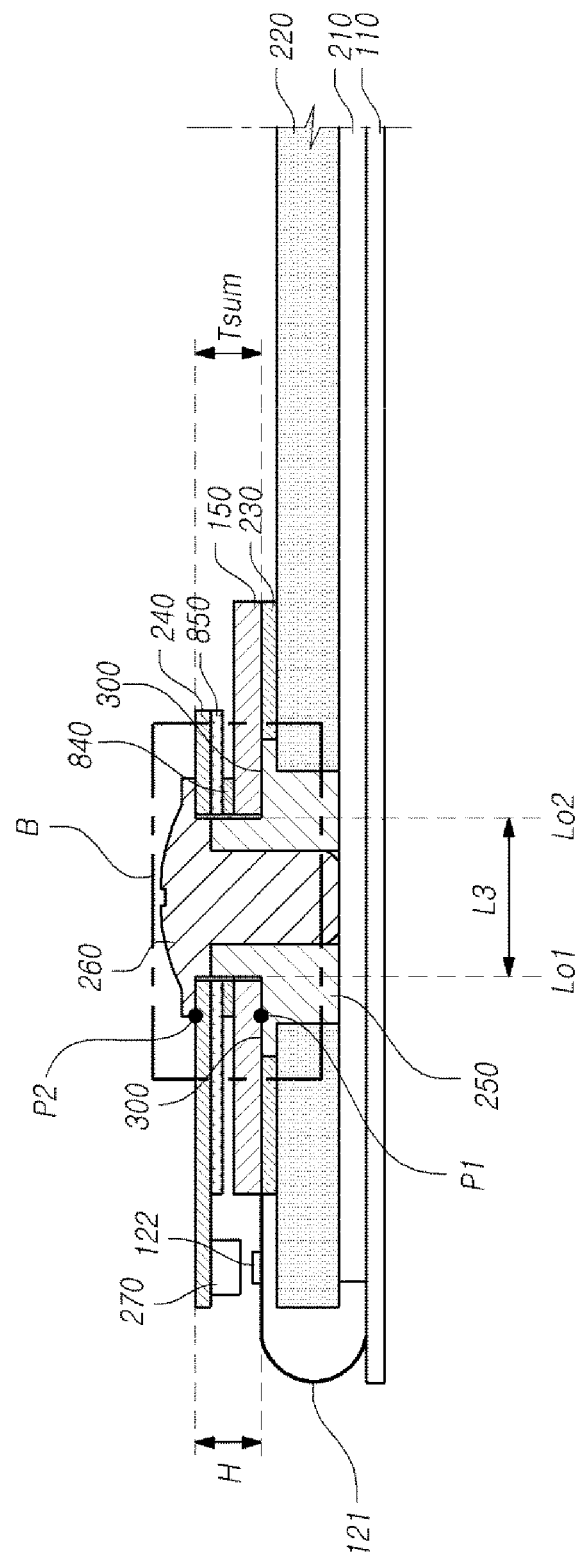
FIG. 8 is a cross-sectional view illustrating another example display device according to some of the disclosed embodiments.
Figure 9:
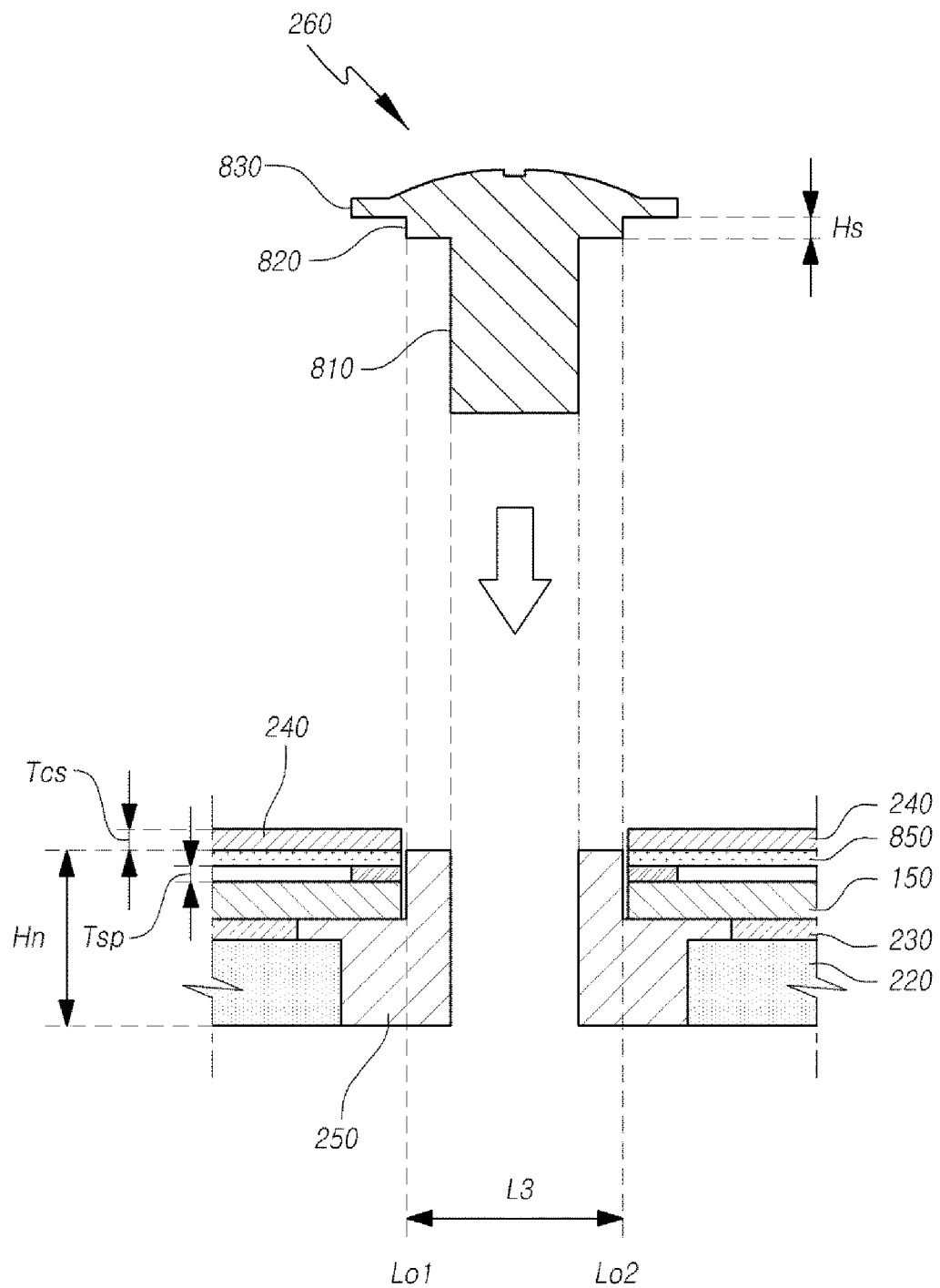
FIG. 9 illustrates another example fastening structure between the SPCB and the back cover in the display device according to one embodiment.
Figure 10:
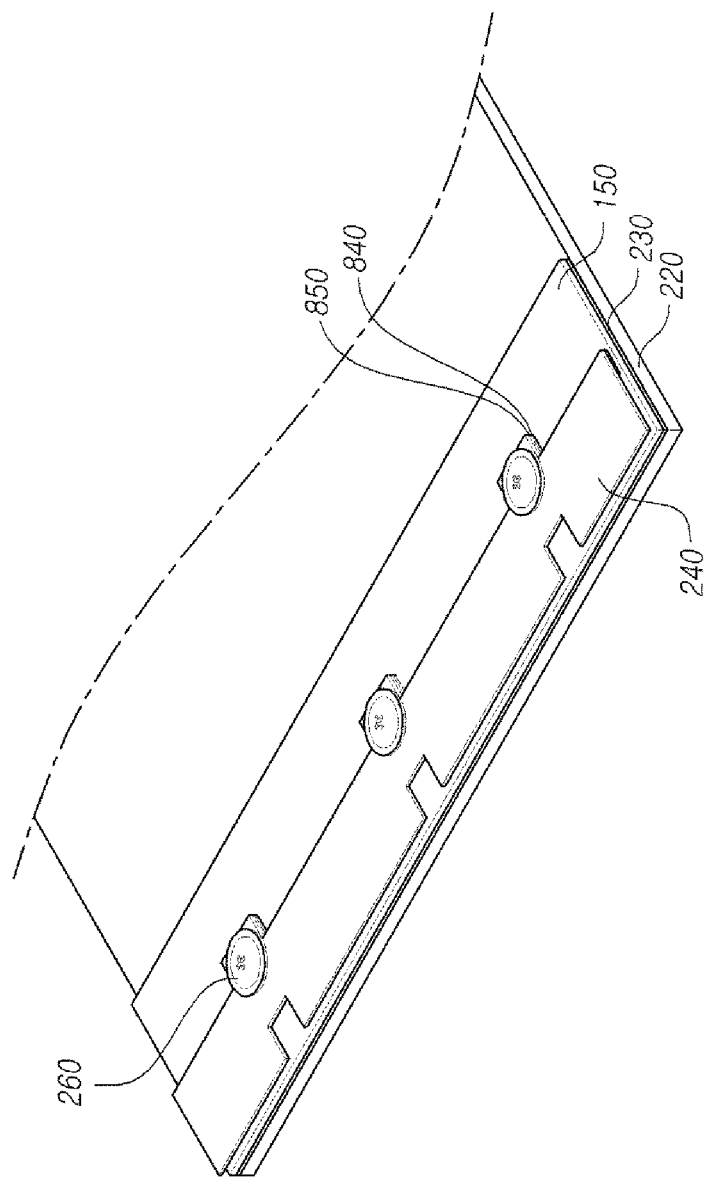
FIG. 10 and FIG. 11 are perspective and exploded perspective views of the fastening structure between the SPCB and the back cover in the display device according to one embodiment.
Figure 11:
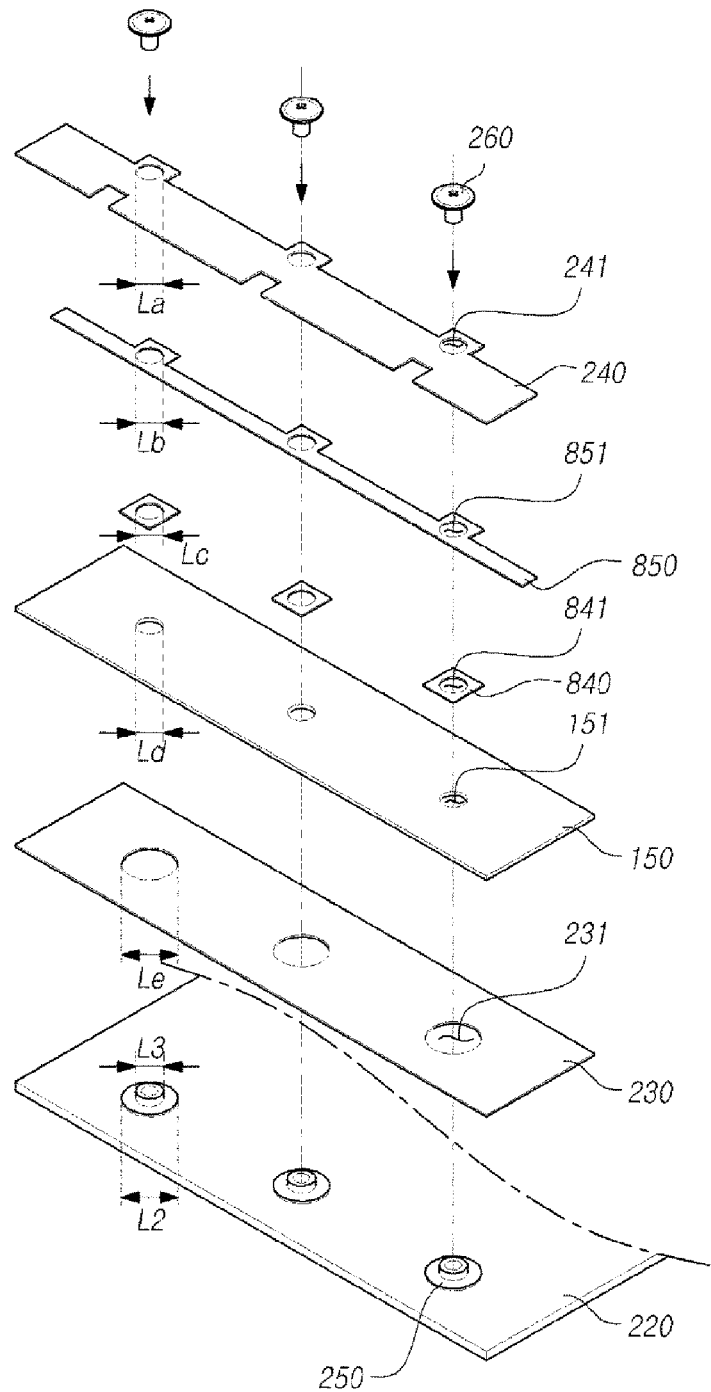

FIG. 8 is a cross-sectional view illustrating another example display device 100 according to one embodiment. FIG. 9 is an enlarged cross-sectional view of part B in FIG. 8, which is the fastening structure between the SPCB 150 and the back cover 220 in the display device 100 according to one embodiment before the SPCB 150 and the back cover 220 are fastened. FIG. 10 and FIG. 11 are perspective and exploded perspective views of the fastening structure between the SPCB 150 and the back cover 220 in the display device 100 according to one embodiment Referring to FIG. 8, the display device 100 according to one embodiment further includes a top insulating plate 850 disposed between the SPCB 150 and the cover shield 240 and having a hole (851 in FIG. 11).

In addition, the display device 100 according to one embodiment further includes a sliding pad 840 disposed between the top insulating plate 850 and the SPCB 150 and having a hole (841 in FIG. 11).

As described above, the top insulating plate 850 is sandwiched between the SPCB 150 and the cover shield 240 to insulate between the SPCB 150 and the cover shield 240, thereby electrically protecting the SPCB 150.

In addition, since the sliding pad 840 is sandwiched between the top insulating plate 850 and the SPCB 150 as described above, it is possible to increase the mobility of the SPCB 150 fixedly fitted between the stopper 300 of the middle body 420 of the nut 250 and the head 830 of the screw 260.

Since the sliding pad 840 allows the SPCB 150 to move slightly, even if the back cover 220 thermally expands or contracts, the SPCB 150 can be protected from being damaged by external physical force, and screen abnormalities can be reduced.

Vibrations, noise, or the like may occur due to the gap between the SPCB 150 and the cover shield 240 that may be formed of a metal material having high thermal conductivity. The sliding pad 840 sandwiched between the top insulating plate 850 and the SPCB 150 can reduce vibrations, noise, and the like.

In order to obtain such effects, the sliding pad 840 may be formed of a material that is electrically insulating while being elastic or flexible. For example, the sliding pad 840 may be formed of a plastic polymer such as polyurethane or polyolefin.

Referring to FIG. 9, the screw 260 includes an engaging portion 810 engaging with the nut 250, a protrusion 820 protruding to the outer circumference Lo1 and Lo2 of the upper body 430 of the nut 250, and the head 830 adjoining the cover shield 240.

The upper body 430 of the nut 250 is fitted into the hole (151 of FIG. 11) of the SPCB 150, the hole (841 of FIG. 11) of the sliding pad 840, and the hole (851 of FIG. 11) of the top insulating plate 850.

The protrusion 820 of the screw 260 adjoins the upper body 430 of the nut 250 when the screw 260 is engaged with the nut 250.

Thus, the height Hs of the protrusion 820 of the screw 260 may correspond to the thickness Tcs of the cover shield 240 (Hs=Tcs).

Referring to FIG. 8, the height H from the top point P1 of the middle body 420 of the nut 250 to the bottom point P2 of the head 830 of the screw 260 may be greater than or equal to the total thickness Tsum of the SPCB 150, the sliding pad 840, the top insulating plate 850, and the cover shield 240 (H≥Tsum).

This configuration prevents the SPCB 150 from being too strongly fixed between the head 830 of the screw 260 and the middle body 420 of the nut 250, thereby increasing the mobility of the SPCB 150.

For example, when designing a product, the thickness Tsp of the sliding pad 840 from among the SPCB 150, the sliding pad 840, the top insulating plate 850, and the cover shield 240 is adjusted, since it is easier to change the thickness of the sliding pad 840. In this manner, it is possible to satisfy the requirement that the height H from the top point P1 of the middle body 420 of the nut 250 to the bottom point P2 of the head 830 of the screw 260 be equal to or greater than the total of the thickness of the SPCB 150, the thickness of the sliding pad 840, the thickness of the top insulating plate 850, and the thickness of the cover shield 240.

In addition, when the sliding pad 840 is formed of an elastic material or a flexible material (e.g. polyolefin), the movability of the SPCB 150 can be further increased.

The structure of the screw 260 allows a space (height) between the cover shield 240 and the SPCB 150 in which the top insulating plate 850 and the sliding pad 840 can be disposed.

The fastening structure between the SPCB 150 and the back cover 220 described with reference to FIG. 8 and FIG. 9 can be more specifically rendered with reference to the perspective view of FIG. 10 and the exploded perspective view of FIG. 11. In FIG. 10 and FIG. 11, the flexible films 121 on which the source driving chips 122 are mounted are omitted for the sake of explanation.

Referring to FIG. 11, the diameter La of the hole 241 of the cover shield 240, the diameter Lb of the hole 851 of the top insulating plate 850, the diameter Lc of the hole 841 of the sliding pad 840, and the diameter Ld of the hole 151 of the SPCB 150 is equal to or greater than the diameter L3 of the upper body 430.

In addition, the diameter Le of the hole 231 of the bottom insulating plate 230 is equal or greater than the diameter L2 of the middle body 420 of the nut 250.

Figure 12:
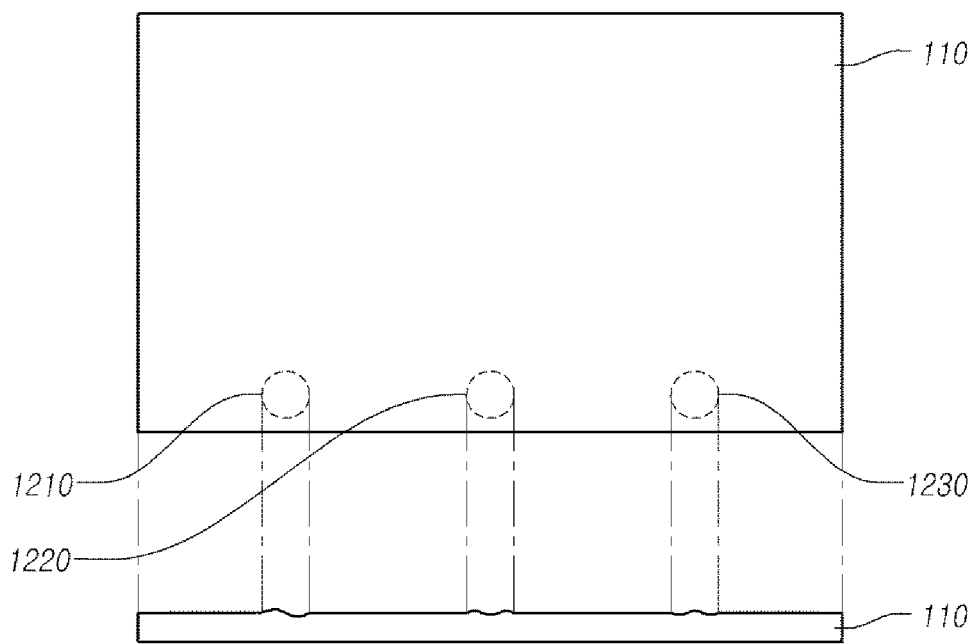
FIG. 12 and FIG. 13 illustrate degradations in screen flatness depending on the fastening structure between the SPCB and the back cover.
Figure 13:
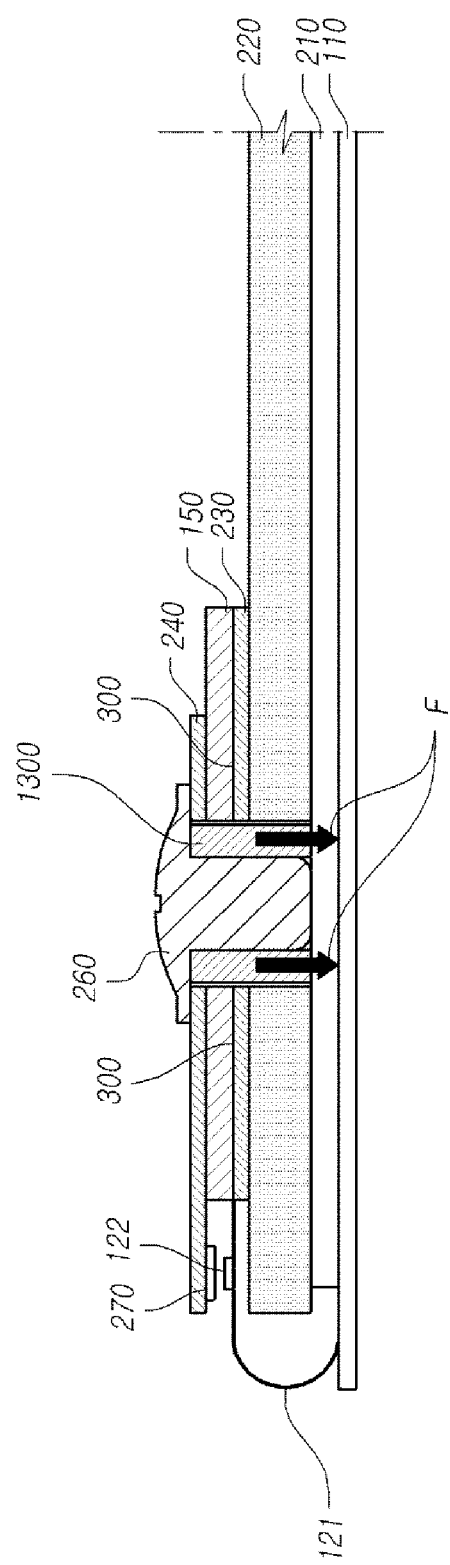

FIG. 12 and FIG. 13 illustrate degradations in screen flatness that may occur in the display device 100.

Referring to FIG. 12, in areas 1210, 1220, and 1230 of the display panel 110 in which the fastening structures between the SPCB 150 and the back cover 220 are disposed, the surface portions of the display panel 110 may suffer from degradations in screen flatness, i.e. the surface portions of the display panel 110 become uneven instead of being smooth.

Referring to FIG. 13, unlike the disclosed embodiments, degradations in screen flatness may be exacerbated when a fastening structure uses a nut structure without the protruding stopper 300, i.e. a nut 1300 without the above-described structure in which the nut 250 is divided into the lower body 410, the middle body 410, and the upper body 430.

Referring to FIG. 13, during assembly of a mechanical structure, when the nut 1300 is press-fitted into the back cover 220, external force F in the direction of panel may be generated. When the external force F is generated, the display panel 110 may be pressed by the nut 1300. This may occur after the assembly of the mechanical structure is completed with the nut 1300 being press-fitted into the cover 220 or after a product is shipped.

When the display panel 110 is pressed by the nut 1300, the surface portions of the panel corresponding to the areas 1210, 1220, and 1230 in which the fastening structures are positioned may become uneven, thereby degrading screen flatness.

Such degradations in screen flatness may significantly lower the quality of a product, such as screen appearance quality, thereby degrading image quality.

As described above, according to the present embodiments, the stopper 300 formed on the middle body 420 of the nut 250 can prevent the nut 250 from being pressed in the direction of the panel, thereby improving screen flatness.

However, as illustrated in FIG. 12, in the areas 1210, 1220, and 1230 of the display panel in which the nuts 250 are present, the screen may become uneven, causing the surface to be non-flat.

As such, even if the nut structure having the stopper 300 on the middle body 420 is applied, a slight degradation in screen flatness may occur. This slight degradation in screen flatness can be removed by adjusting the length of the protrusion of the stopper 300 on the middle body 420 of the nut 250 or adjusting the height of the nut 250, as illustrated in FIG. 14 and FIG. 15.

Figure 14:
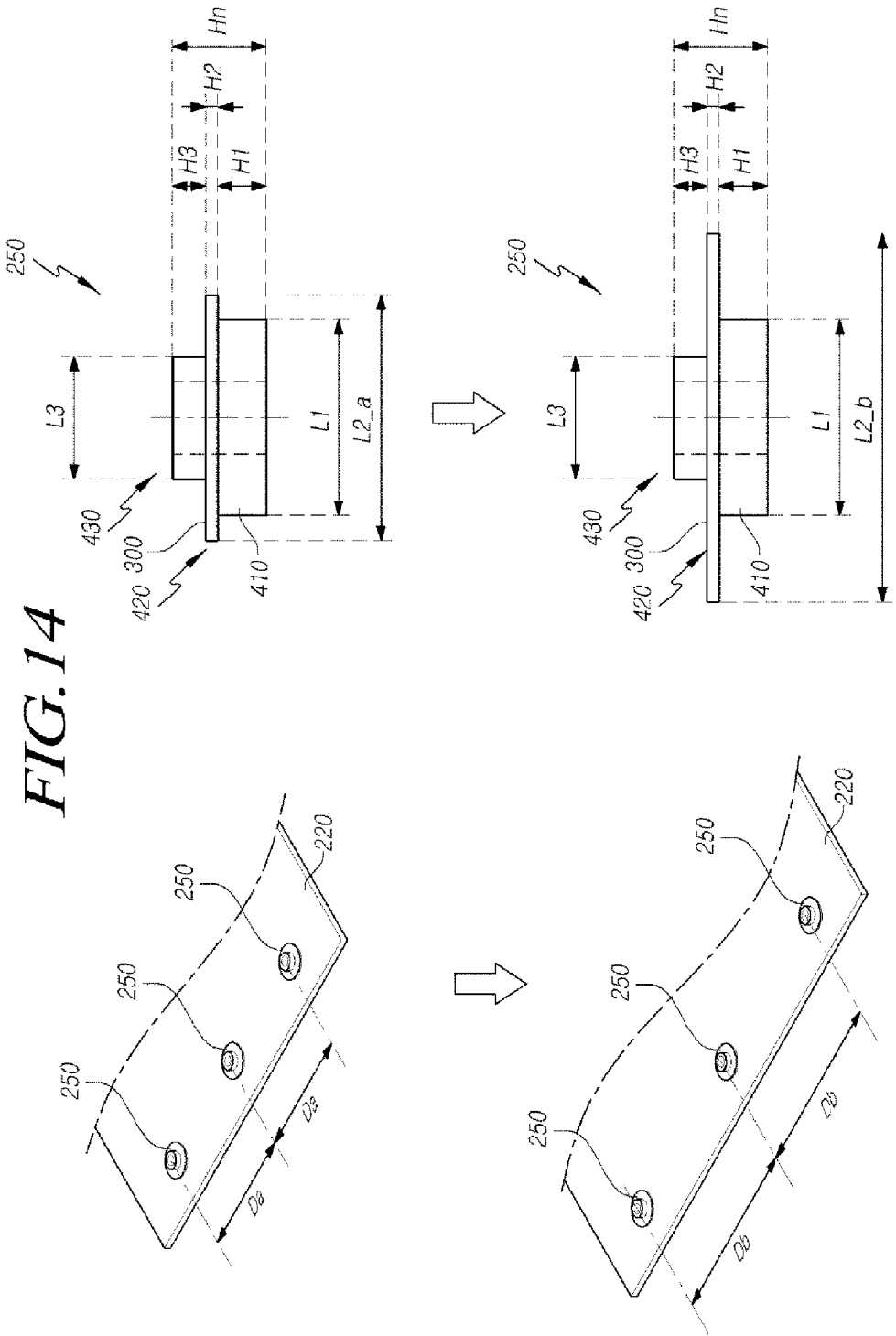
FIG. 14 and FIG. 15 illustrate modifications in the structure of the nut depending on the distance between the adjacent nuts in the fastening structure between the SPCB and the back cover in the display device according to one embodiment.
Figure 15:
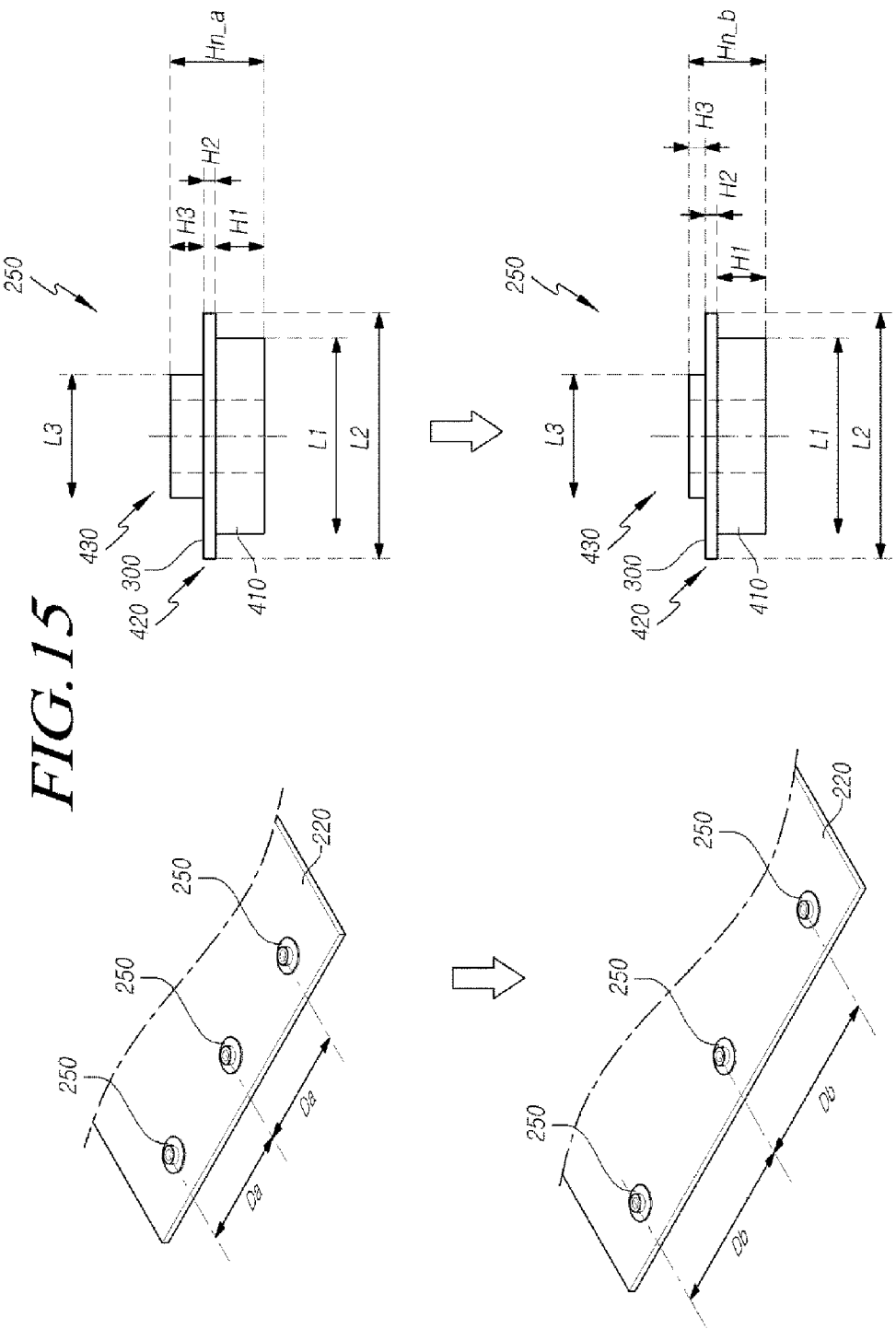

To improve the reliability and firmness of the press-fit of the nut 250 into the back cover 220, the length of the protrusion of the stopper 300 on the middle body 420 of the nut 250 or the height of the nut 250 may be adjusted. This adjustment can consequently reduce the movement of the nut 250. It is therefore possible to prevent the display panel from being pressed by the movement of the nut 250 press-fitted into the back cover 220, thereby further improving screen flatness. This will be described in more detail as follows:

FIG. 14 and FIG. 15 illustrate modifications in the structure of the nut 250 depending on the distance between the adjacent nuts in the fastening structure between the SPCB 150 and the back cover 220 in the display device 100 according to one embodiment, the structure of the nut being modified in order to improve screen flatness.

Referring to FIG. 14, when the distance between the nuts 250 increases from Da to Db due to the reduced number of the nuts 250 while the length of the SPCB 150 remains the same or when the distance between the nuts 250 increases from Da to Db due to the increased length of the SPCB 150 along with the use of a larger area display panel 110, degradations in flatness may get worse, i.e. the screen may become more uneven in the areas 1210, 1220, and 1230 in which the nuts 250 are present.

The length of the protrusion of the stopper 300 can be expressed as (L2−L1)/2.

When the distance between the nuts 250 is increased, the length (L2−L1)/2 of the protrusion of the stopper 300 on the middle body 420 of the nuts 250 can be further increased, thereby reducing degradations in screen flatness.

Describing the diameter L2 of the middle body 420 of the nuts 250 in relation to the distance between the nuts 250, the diameter L2 of the middle body 420 of the nuts 250 is proportional to the distance between the nuts 250.

That is, the diameter L2 of the middle body 420 of the nuts 250 can be greater with increases in the distance between the nuts 250 and can be smaller with decreases in the distance between the nuts 250.

Referring to FIG. 14, when the distance between the nuts 250 has a smaller value Da, the diameter L2 of the middle body 420 of the nuts 250 is L2_a. When the distance between the nuts 250 has a greater value Db (>Da), the diameter L2 of the middle body 420 of the nuts 250 is increased to L2_b, which is greater than L2_a.

As described above, it is possible to improve screen flatness by increasing the diameter L2 of the middle body of the nuts 250 with increases in the distance between the nuts 250.

In addition, when the diameter L2 of the middle body 420 of the nuts 250 is constant, the distance between the nuts 250 can be increased within the range in which screen flatness does not get worse. That is, it is possible to determine the number of the nuts 250, the distance between the nuts 250, and the like considering the diameter L2 of the middle body 420 of the nuts 250.

Referring to FIG. 15, when the distance between the nuts 250 increases from Da to Db due to the reduced number of the nuts 250 while the length of the SPCB 150 remains the same or when the distance between the nuts 250 increases from Da to Db due to the increased length of the SPCB 150 along with the use of a larger area display panel 110, degradations in flatness may get worse, i.e. the screen may become more uneven in the areas 1210, 1220, and 1230 in which the nuts 250 are present.

When the distance between the nuts 250 increases, it is possible to decrease the height Hn of the nuts 250, thereby reducing degradations in screen flatness.

Here, it is possible to decrease the height Hn of the nuts 250 by reducing the size of the upper body 430.

Referring to FIG. 15, when the distance between the nuts 250 has a smaller value Da, the height Hn of the nuts 250 is Hn_a. When the distance between the nuts 250 has a greater value Db (>Da), the height Hn of the nuts 250 can be decreased to Hn_b, which is less than Hn_a.

As described above, it is possible to decrease the height Hn of the nuts 250 with increases in the distance of the nuts 250, thereby improving screen flatness.

In addition, when the height Hn of the nuts 250 is constant, the distance between the nuts 250 can be increased within the range in which screen flatness does not get worse. That is, it is possible to determine the number of the nuts 250, the distance between the nuts 250, and the like considering the height Hn of the nuts 250.

Describing the height Hn of the nuts 250 in relation to the distance between the nuts 250, the height Hn of the nuts 250 is inversely proportional to the distance between the nuts 250.

Figure 16:
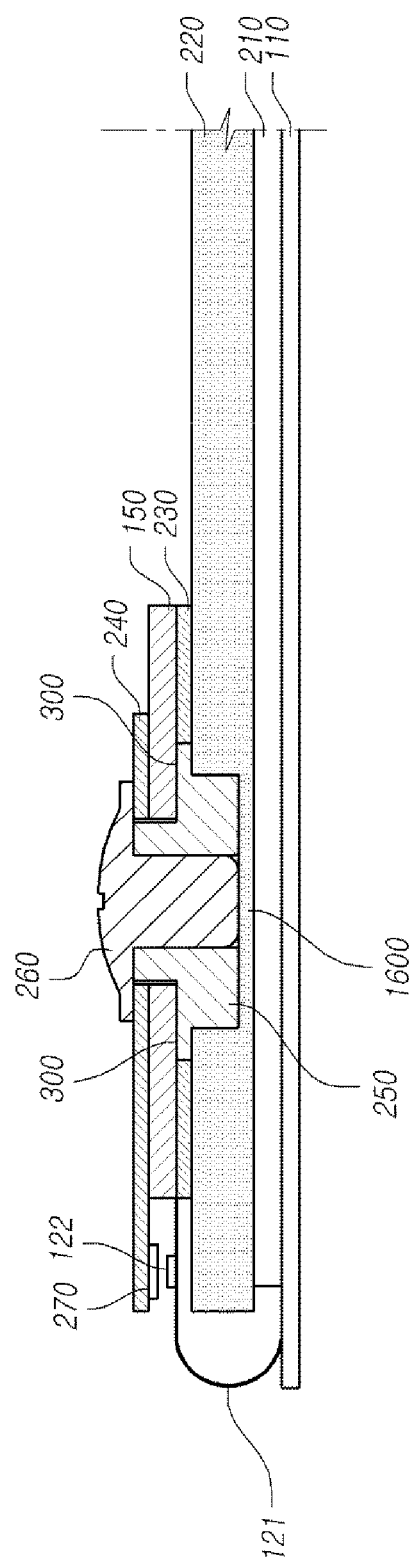
FIG. 16 and FIG. 17 illustrate another example structure of the nut in the fastening structure between the SPCB and the back cover in the display device according to one embodiment.
Figure 17:
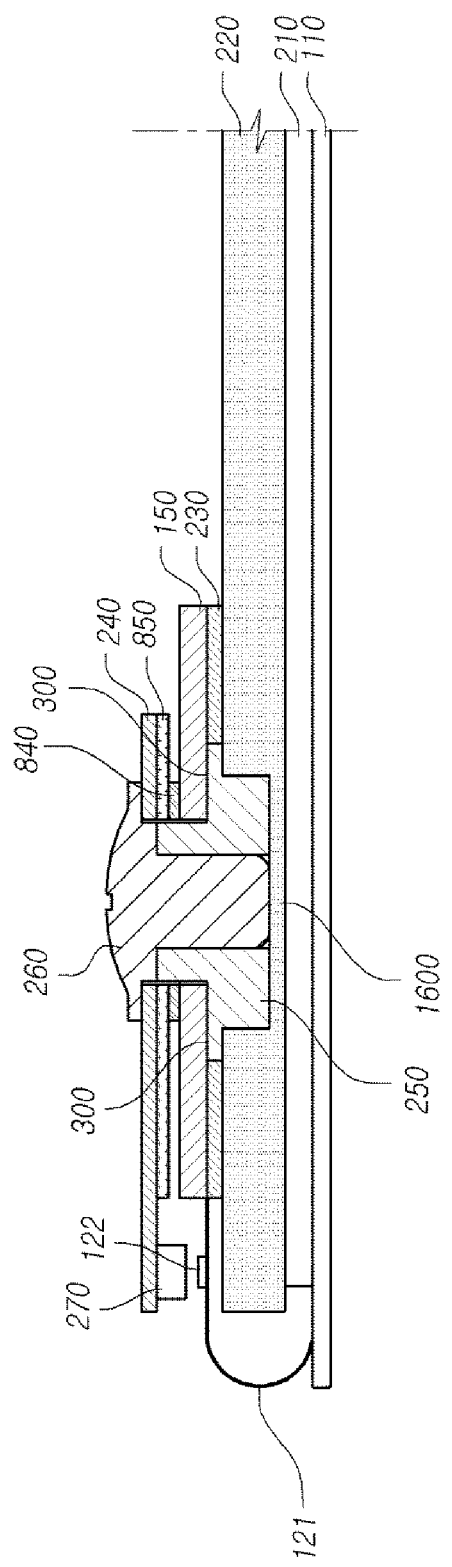

FIG. 16 and FIG. 17 illustrate another example structure of the nut 250 in the fastening structure between the SPCB 150 and the back cover 220 in the display device 100 according to one embodiment, the nut structure being designed to further improve screen flatness.

FIG. 16 illustrates the structure of the nut 250 modified from that included in the fastening structure illustrated in FIG. 2, and FIG. 17 illustrates the structure of the nut 250 modified from that included in the fastening structure illustrated in FIG. 8.

In the former structures, as illustrated in FIG. 2 to FIG. 9, the back cover 220 has the hole, into which the nut 250 can be press-fitted.

According to this structure, during the assembly process, the position in which the nut 250 is press-fitted can be determined from the backside of the back cover 220, which indicates whether the nut 250 is fitted into the back cover 220. However, this structure may not completely prevent the lower body 410 of the nut 250 from being pressed in the direction of the panel, causing degradations in screen flatness.

As illustrated in FIG. 16 and FIG. 17, the space in the back cover 220 into which the nut 250 is press-fitted is formed as a recess instead of the hole. This configuration can prevent the nut 250 press-fitted into the back cover 220 from being pressed in the direction of the panel.

Since this structure allows the nut 250 to be press-fitted into the recess in the back cover 220, the closed bottom 1600 of the recess in the back cover 220 can reduce or eliminate force from the nut 250 being pressed in the direction of the panel.

As described above, the present embodiments can provide three schemes for improving screen flatness. The three schemes for improving screen flatness can be briefed as follows:

(1) The structure having the stopper 300 on the middle body 420 of the nut 250 can reduce or eliminate force from the nut 250 being pressed in the direction of the panel, thereby improving screen flatness.

(2) It is possible to help the nut 250 press-fitted into the back cover 220 be firmly and reliably seated therein by adjusting the length of the protrusion of the stopper 300 on the middle body 420 of the nut 250 or by adjusting the height of the nut 250. This can reduce or eliminate force from the nut 250 press-fitted into the back cover 220 pressing the display panel 110, thereby improving screen flatness.

(3) The portion of the back cover 220 into which the nut 250 is press-fitted is formed as a recess instead of a hole. This configuration can reduce or eliminate force from the nut 250 press-fitted into the back cover 220 pressing the display panel 110, thereby improving screen flatness.

Figure 18:
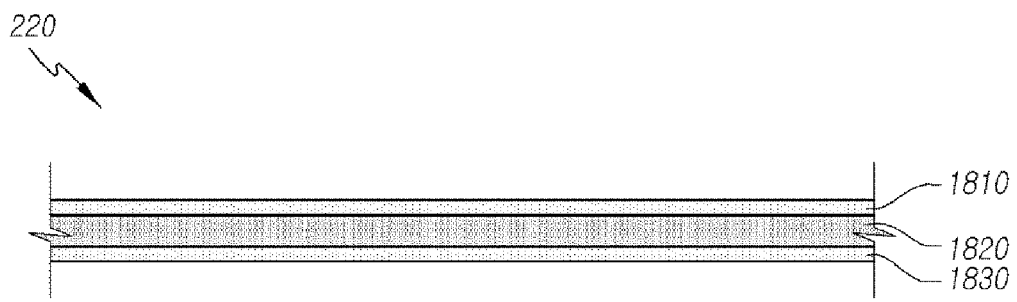
FIG. 18 is a cross-sectional view illustrating the structure of the back cover of the display device according to one embodiment.

FIG. 18 is a cross-sectional view illustrating the structure of the back cover 220 of the display device 100 according to one embodiment.

Referring to FIG. 18, the back cover 220 of the display device 100 according to one embodiment has a multilayer structure including three or more layers.

In the multilayer structure of the back cover 220 that includes three or more layers, the electrical conductivity and the thermal conductivity of the two outermost layers 1810 and 1830 are higher than the electrical conductivity and the thermal conductivity of at least one intermediate layer 1820.

Thus, the back cover 220 can act as a ground using the two outermost layers 1810 and 1830.

In addition, the differences in the electrical conductivity and the thermal conductivity between the two outermost layers 1810 and 1830 and the intermediate layer 1820 of the back cover 220 can prevent the back cover 220 from bending or reduce the amount of bending when the ambient temperature increases or decreases, thereby significantly reducing screen abnormalities.

In particular, when the size of the back cover 220 increases along with the use of a larger area display panel 110, the back cover 220 may be more bent or deformed through thermal expansion or contraction. It is possible to prevent the back cover 220 from being bent or deformed (or at least reduce bending or deformation) by designing the back cover 220 to have the multilayer structure including three or more layers, in which the two outermost layers 1810 and 1830 have high electrical and thermal conductivity, and the intermediate layer 1820 has low electrical and thermal conductivity.

For example, the back cover 220 may have a triple-layer structure in which the two outermost layers 1810 and 1830 are conductors formed of a metal, such as aluminum (Al), and the intermediate layer 1820 is a non-conductor.

The two outermost layers 1810 and 1830 may be formed of a metal, such as Al. One or both of the two outermost layers 1810 and 1830 may be formed of an alloy containing Al.

According to the present embodiments as set forth above, it is possible to provide the display device 100 having the fastening structure (i.e. the fastening structure between the PCB 150 and the back cover 220) that does not cause screen abnormalities.

According to the present embodiments, it is possible to provide the display device 100 having the fastening structure (i.e. the fastening structure between the PCB 150 and the back cover 220) able to remove or minimize the effect of thermal expansion or contraction of the back cover 220 or the like.

According to the present embodiments, it is possible to provide the display device 100 having the fastening structure (i.e. the fastening structure between the PCB 150 and the back cover 220) allowing for improvements in screen flatness.

According to the present embodiments, it is possible to provide the display device 100 having the fastening structure (i.e. the fastening structure between the PCB 150 and the back cover 220) able to act as an electrostatic discharge path.

The foregoing descriptions and the accompanying drawings have been presented in order to explain the certain principles of the present invention. A person skilled in the art to which the invention relates can make many modifications and variations by combining, dividing, substituting for, or changing the elements without departing from the principle of the invention. The foregoing embodiments disclosed herein shall be interpreted as illustrative only but not as limitative of the principle and scope of the invention. It should be understood that the scope of the invention shall be defined by the appended claims and all of their equivalents fall within the scope of the invention.

What is claimed is:

1. A display device comprising:
a display panel;
a back cover having a front side facing the display panel and a rear side opposite the front side, the back cover having a back cover cavity open on at least the rear side of the back cover;
a nut coupled to the back cover, a lower body of the nut disposed in the back cover cavity, a stopper of the nut protruding along the rear side of the back cover and in contact with the rear side of the back cover, the nut having a fastening cavity;
a screw comprising an engaging portion and a head, the engaging portion held in the fastening cavity of the nut, the screw securing a printed circuit board between the head of the screw and the back cover; and
a bottom insulating plate disposed between the printed circuit board and the back cover, the bottom insulating plate configured to prevent a short circuit between the printed circuit board and the back cover, the stopper of the nut disposed in a hole in the bottom insulating plate.

2. The display device of claim 1, wherein the stopper of the nut is disposed between the lower body and an upper body of the nut, the stopper having a greater diameter than the lower body and the upper body, the upper body disposed in a hole in the printed circuit board.

3. The display device of claim 2, wherein the lower body has a greater diameter than the upper body.

4. The display device of claim 1, wherein the head of the screw contacts a cover shield disposed between the head of the screw and the printed circuit board, the cover shield configured to dissipate heat from the printed circuit board.

5. The display device of claim 4, wherein the head of the screw secures a top insulating plate between the cover shield and the printed circuit board, the top insulating plate configured to insulate the printed circuit board from the cover shield.

6. The display device of claim 4, wherein the head of the screw secures a sliding pad disposed between the cover shield and the printed circuit board, the sliding pad configured to enable mobility of the printed circuit board relative to the cover shield.

7. The display device of claim 1, further comprising a cover shield disposed between the printed circuit board and the head of the screw, the cover shield configured to dissipate heat from the printed circuit board, wherein the screw includes a protrusion between the head of the screw and the engaging portion, the protrusion having a diameter greater than the engagement portion of the screw and smaller than the head of the screw, the protrusion disposed in a hole in the cover shield.

8. The display device of claim 1, wherein the fastening cavity is a fastening hole open on the rear side of the back cover and the front side of the back cover.

9. The display device of claim 1, wherein the back cover has a multilayered structure including a middle layer disposed between two outer layers having higher thermal conductivity and electrical conductivity than the middle layer.

10. The display device of claim 1, wherein the stopper electrically connects the rear side of the back cover to a front side of the printed circuit board facing the back cover.

11. A fastening structure in a display device, the fastening structure comprising:
a nut comprising:
a lower body disposed in a back cover cavity in a back cover having a front side facing a display panel and a rear side opposite the front side cover, the back cover cavity open on at least the rear side of the back cover;
a stopper protruding along the rear side of the back cover and in contact with the rear side of the back cover; and
an upper body is dimensioned to be disposed in a hole in a cover shield of the display device, a printed circuit board disposed between the cover shield and the stopper, the cover shield configured to dissipate heat from the printed circuit board; and
a screw engaged with the nut, the screw comprising:
an engaging portion held in a fastening cavity within at least the lower body and the stopper; and
a head securing a printed circuit board of the display device between the head of the screw and the back cover.

12. The fastening structure of claim 11, wherein the stopper of the nut is dimensioned to be disposed in a hole in a bottom insulating plate of the display device, the bottom insulating plate disposed between the printed circuit board and the back cover, the bottom insulating plate configured to prevent a short circuit between the printed circuit board and the back cover.

13. The fastening structure of claim 11, wherein the screw includes a protrusion between the head of the screw and the engaging portion, the screw's protrusion having a diameter greater than the screw's engagement portion and less than the screw's head, the screw's protrusion disposed in a hole in a cover shield disposed between the printed circuit board and the head of the screw, the cover shield configured to dissipate heat from the printed circuit board.

14. The fastening structure of claim 11, wherein the stopper is disposed between the lower body and the upper body of the nut, the stopper having a diameter greater than a diameter of the lower body and a diameter of the upper body, the upper body dimensioned to be disposed in a hole in a printed circuit board of the display device.

15. The fastening structure of claim 11, wherein the lower body has a greater diameter than the upper body.

16. The fastening structure of claim 11, wherein the upper body is dimensioned to be disposed in a hole in a top insulating plate between the cover shield and the printed circuit board, the top insulating plate configured to insulate the printed circuit board from the cover shield.

17. The fastening structure of claim 11, wherein the upper body is dimensioned to be disposed in a hole in a sliding pad between the cover shield and the printed circuit board, the sliding pad configured to enable mobility of the printed circuit board relative to the cover shield.

18. A method of manufacturing a display device, the method comprising:
fitting a lower body of a nut into a back cover cavity in a back cover through an opening in a rear side of the back cover opposite a front side of the back cover facing a display panel to place a stopper of the nut in contact with the rear side of the back cover, the stopper of the nut protruding along the rear side of the back cover;
placing a bottom insulating plate onto the rear side of the back cover, a hole in the bottom insulating plate placed around the stopper of the nut;
placing a printed circuit board onto the bottom insulating plate and the stopper of the nut, a hole in the printed circuit board placed around an upper body of the nut having a diameter less than a diameter of the stopper; and
joining an engaging portion of a screw into a fastening cavity in the nut to cause a head of the screw to secure the printed circuit board and the bottom insulating plate to the back cover.

* * * * *